(12) United States Patent
Li et al.

(10) Patent No.: US 7,626,423 B1
(45) Date of Patent: Dec. 1, 2009

(54) SLEW RATE CONTROL FOR OUTPUT SIGNALS

(75) Inventors: Richard C. Li, Cupertino, CA (US); Phillip A. Young, Albuquerque, NM (US); James A. Walstrum, Jr., San Jose, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 11/999,196

(22) Filed: Dec. 3, 2007

(51) Int. Cl.
*H03K 19/0175* (2006.01)

(52) U.S. Cl. .................... 326/86; 326/83; 326/27; 326/38

(58) Field of Classification Search .................... 326/86, 326/38–41
See application file for complete search history.

(56) References Cited

U.S. PATENT DOCUMENTS

| 6,653,873 | B1 * | 11/2003 | Nguyen | 327/112 |
| 6,768,363 | B2 * | 7/2004 | Yoo et al. | 327/170 |
| 6,791,356 | B2 * | 9/2004 | Haycock et al. | 326/82 |
| 7,378,878 | B2 * | 5/2008 | Major | 326/87 |
| 7,405,597 | B1 * | 7/2008 | Pitkethly | 326/86 |

* cited by examiner

*Primary Examiner*—Vibol Tan
(74) *Attorney, Agent, or Firm*—William L. Paradice, III; John J. King

(57) ABSTRACT

An output circuit allows the slew rate of its output signal to be selectively adjusted. The output driver circuit includes an output driver and pre-driver circuits. The output driver includes an output transistor coupled between a first supply voltage and the output terminal. The pre-driver circuit selectively adjusts a series resistance between the output transistor's gate and a second supply voltage in response to mode control signals.

16 Claims, 8 Drawing Sheets

SLEW RATE CONTROL FOR OUTPUT SIGNALS

FIELD OF INVENTION

The present invention relates generally to integrated circuits, and more specifically to voltage regulation in integrated circuits.

DESCRIPTION OF RELATED ART

A programmable logic device (PLD) is a general-purpose device that can be programmed by a user to implement a variety of selected functions. One type of PLD is the Field Programmable Gate Array (FPGA), which typically includes an array of configurable logic blocks (CLBs) surrounded by a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated configuration memory cells that control various switches and multiplexers within the CLBs, IOBs, and the interconnect structure to implement logic and routing functions specified by the configuration data.

Changing system requirements are driving the need for high bandwidth input/output (I/O) interface standards support. Thus, higher performance systems, driven by faster processors and memories, are increasing the need for higher bandwidth data transfers. In response to these system changes, new I/O standards are continually emerging. For one example, many modern processing systems operate according to the well-known PCI standard. For another example, other modern processing systems use the High Speed Transceiver Logic (HSTL) standard for data transfers to and from memory, and use the Low Voltage Differential Signaling (LVDS) standard for backplane communications. As a result, the IOBs of many FPGA devices can be configured to implement high switching speeds according to various I/O interface standards, for example, such as PCI, HSTL, LVCMOS, TTL, and other well-known standards.

However, the fast I/O signal switching speeds typically exhibited by FPGA devices are not suitable for all applications, and in some cases may even preclude the deployment of FPGA devices in systems that would otherwise be ideal for FPGA devices. For example, although the configurable nature of FPGA devices renders the devices ideal for performing test and de-bug operations for embedded systems, the deployment of FPGA devices in a system's circuit boards that are not optimized high-speed I/O signal switching speeds (e.g., such boards are commonly referred to as "breadboards") can undesirably cause logic upset of logic components included in the system because the signal switching speed of the FPGA device is too fast.

To ensure compatibility between an FPGA device and other IC devices connected thereto, the output drivers of the FPGA device should operate according to a slew rate specified by the other IC devices. The slew rate of an output driver is defined as the rate at which the output driver transitions its output signal between logic states, which is typically measured in volts per unit of time. For example, the PCI standard specifies an operating voltage of 3.3 volts (v) and an I/O signal slew rate of between 1 v/ns and 4 v/ns. Thus, if the specified slew rate is not met by the FPGA's output driver, the FPGA device may be incompatible with the other chips or devices. Further, although higher operating frequencies are generally desired, if the FPGA output driver's slew rate is too high, undesirable noise may be introduced into the output signal.

One solution to the aforementioned logic upset problems in slower-speed breadboard systems is to manufacture different versions of an FPGA device to include output drivers operating according to different slew rates so that each FPGA version may be employed in a system having a different specified slew rate. However, providing different versions of an FPGA device increases costs and reduces the economies of scale that have made FPGA devices a successful, cost-effective alternative to application-specific integrated circuit (ASIC) devices.

In addition, the operating voltage of many FPGA devices can be programmed to a desired level by a customer to comply with a particular I/O standard, such as the PCI standard. Because the slew rate of an output signal is affected by the device's operating voltage (e.g., increasing the operating voltage typically decreases transistor propagation delays and thus increases the output signal slew rate), changing the operating voltage can undesirably change the output signal slew rate.

Therefore, there is a need for an output driver of an FPGA device to be configurable to generate output signals having different slew rates so that the same FPGA device may be used in various applications having different specified I/O signal slew rates and different operating voltages.

SUMMARY

A method and apparatus are disclosed that allow the slew rate of an output driver to be controlled and selectively adjusted so that the output driver is compatible with other IC circuits and devices having different specified I/O signal switching speeds and characteristics. In accordance with the present invention, an output circuit for an integrated circuit (IC) device, such as an FPGA, has an output terminal for providing an output signal and includes a pre-driver circuit that is configurable to adjust the slew rate of the output signal to a desired level. For some embodiments, the output driver includes a PMOS output transistor coupled between a supply voltage and the output terminal, and includes an NMOS output transistor coupled between the output terminal and ground potential. For some embodiments, the pre-driver circuit includes first and second pre-driver circuits. The first pre-driver circuit has an input to receive a logic signal, an output coupled to the gate of the PMOS output transistor, and an input to receive a mode control signal, wherein the first pre-driver circuit selectively adjusts a series resistance between the PMOS output transistor's gate and ground potential in response to the mode control signal, thereby adjusting the turn-on speed of the PMOS output transistor. The second pre-driver circuit has an input to receive the logic signal, an output coupled to the gate of the NMOS output transistor, and an input to receive the mode control signal, wherein the second pre-driver circuit selectively adjusts a series resistance between the NMOS output transistor's gate and the supply voltage in response to the mode control signal, thereby adjusting the turn-on speed of the NMOS output transistor.

The mode control signal can be stored in a memory element, or can be hardwired to a desired logic state.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are described below in the context of an exemplary FPGA architecture for simplicity only. It is to be understood that present embodiments are equally applicable to other PLD architectures such as FPGAs and complex PLDs, and to other types of integrated circuits including, for example, application-specific integrated circuit (ASIC) devices. In the following description, for purposes of explanation, specific nomenclature is set forth to provide a thorough understanding of the present invention. In other instances, well-known circuits and devices are shown in block diagram form to avoid obscuring the present invention unnecessarily. Further, the logic states of various signals described herein are exemplary and therefore may be reversed or otherwise modified as generally known in the art. Additionally, the interconnection between circuit elements or blocks may be shown as buses or as single signal lines. Each of the buses may alternatively be a single signal line, and each of the single signal lines may alternatively be a bus. Further, although described below with respect to a particular output driver circuit, embodiments of the present invention can be implemented in any circuit, buffer, or driver to provide an adjustable output signal slew rate. Accordingly, the present invention is not to be construed as limited to specific examples described herein but rather includes within its scope all embodiments defined by the appended claims.

Figure 1A:
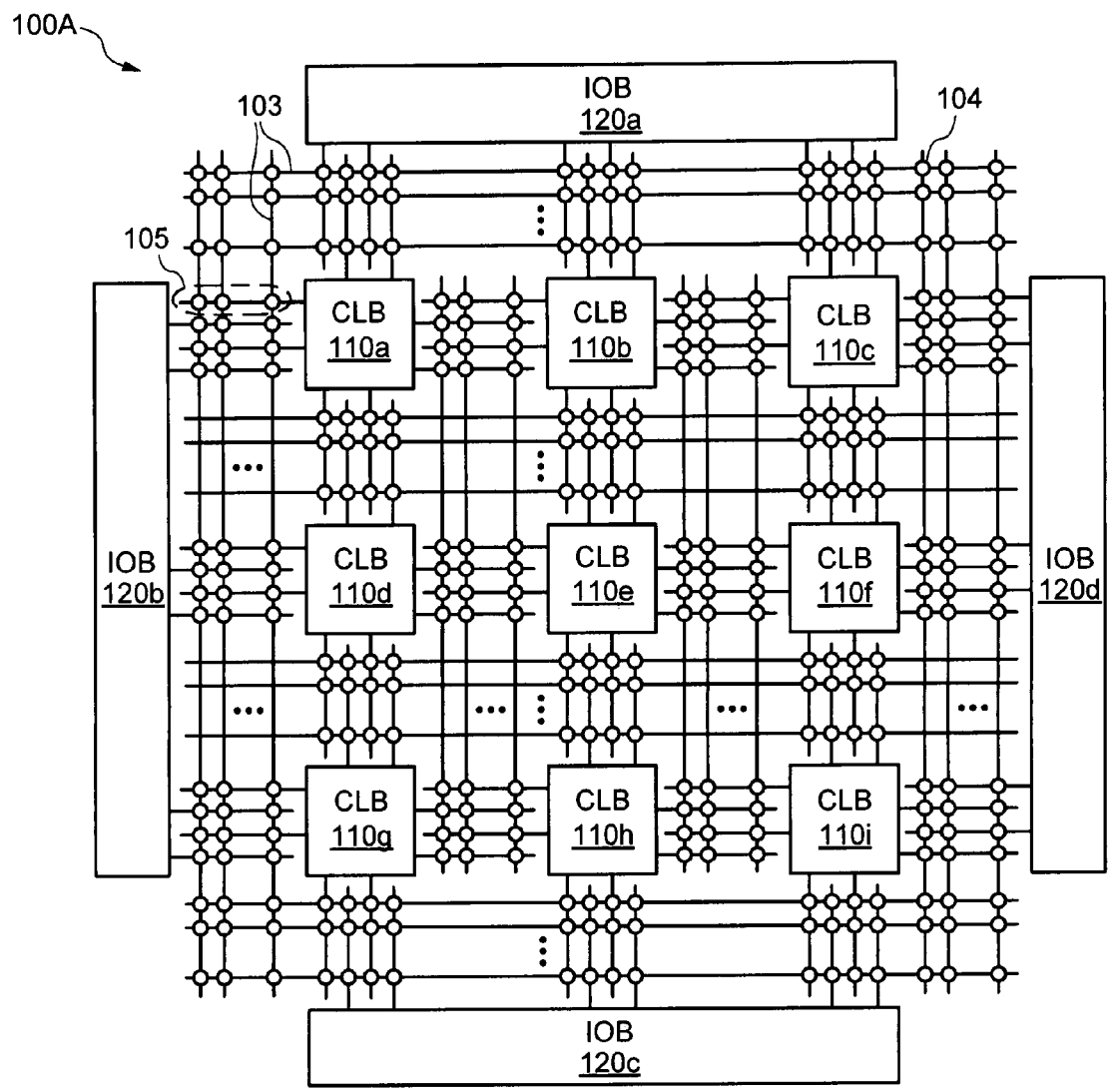
FIG. 1A is simplified block diagram of a conventional FPGA architecture within which embodiments of the present invention may be implemented.

FIG. 1A shows a simplified block diagram of an exemplary FPGA architecture 100A within which embodiments of the present invention can be implemented. FPGA 100 includes an array of configurable logic blocks (CLBs) 110a-110i and programmable input/output blocks (IOBs) 120a-120d. The CLBs 110 and IOBs 120 are selectively interconnected by a programmable interconnect structure that includes a plurality of interconnect lines 103 interconnected by a number of programmable interconnect points (PIPs) 104. The PIPs 104 are often arranged in groups (e.g., group 105) to implement multiplexer circuits that select one of several interconnect lines to provide a signal to a destination interconnect line or logic block. CLBs 110 are individually programmable and can be configured to perform a variety of logic functions on a few input signals. IOBs 120 can be configured to drive output signals from CLBs 110 to external pins (not shown for simplicity) of the FPGA and/or to receive input signals from the external FPGA pins. To ensure compatibility with various I/O standards, some embodiments of IOBs 120 can be configured to operating according to various I/O interface standards, for example, such as PCI, HSTL, SSTL, LVCMOS, and LVTTL, as well as other well-known standards. For one embodiment, IOBs 120 are the Select-IO block developed by Xilinx, Inc., which is the assignee of the present invention. The CLBs 110, IOBs 120, and the general interconnect structure (e.g., PIPs 104) may be programmed by loading configuration data into associated configuration memory cells (not shown in FIG. 1A for simplicity) that control various switches, multiplexers, and other elements within the CLBs, IOBs, and the interconnect structure to implement a user circuit design embodied by the configuration data. Typically, the configuration memory cells are volatile memory cells, such as SRAM cells, that do not retain data when power is removed. An FPGA may include other types of configurable resources, such as multipliers, processors, transceivers, DSP blocks, clock managers, etc.

Figure 1B:
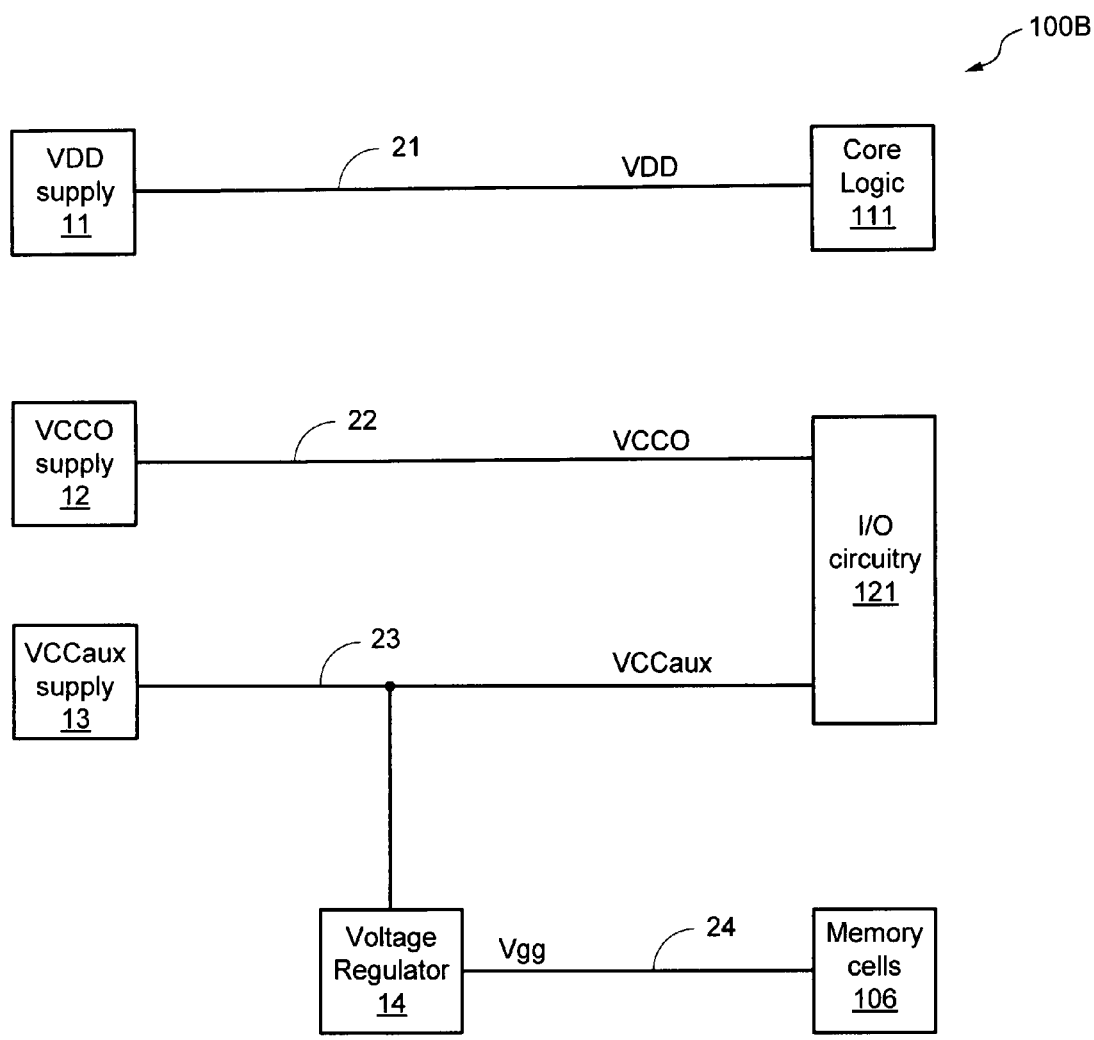
FIG. 1B is a simplified functional block diagram illustrating an exemplary power distribution system of the FPGA architecture of FIG. 1A.

For many FPGA devices such as FPGA 100A of FIG. 1A, different components are powered using different voltage supplies. For example, FIG. 1B shows a circuit device 100B that is generally representative of the power distribution system utilized by the Spartan-3 series of FPGA devices offered by Xilinx, Inc. Device 100B is shown to include an internal voltage supply (VDD) circuit 11, a main voltage (VCCO) supply circuit 12, an auxiliary voltage (VCCaux) supply circuit 13, and a voltage regulator circuit 14. Core logic elements 111 such as CLBs 110 are powered by VDD, I/O circuitry 121 such as IOBs 120 are powered by VCCO and VCCaux, where VCCaux is typically greater than VCCO, and configuration memory 106 cells are powered by a regulated voltage (Vgg) that is generated from VCCaux using a well-known voltage regulator circuit 14. For purposes of discussion herein and for current technologies, VDD typically has a value of approximately 1.0 v-1.2 v, VCCO provides a standard operating voltage (e.g., such as 1.2 v, 1.5 v, 1.8 v, 2.5 v, or 3.3 v) depending upon the selected I/O standard, VCCaux has a selectable value of approximately 2.5 v or approximately 3.3 v, and Vgg is regulated to approximately 1.3 v-1.5 v. Of course, for other embodiments, VDD, VCCO, VCCaux, and Vgg can be other suitable voltages. Further, for still other embodiments, core logic elements 111 and I/O circuitry 121 can be powered by the same supply voltage (e.g., where VDD=VCCO=VCCaux).

Figure 2:
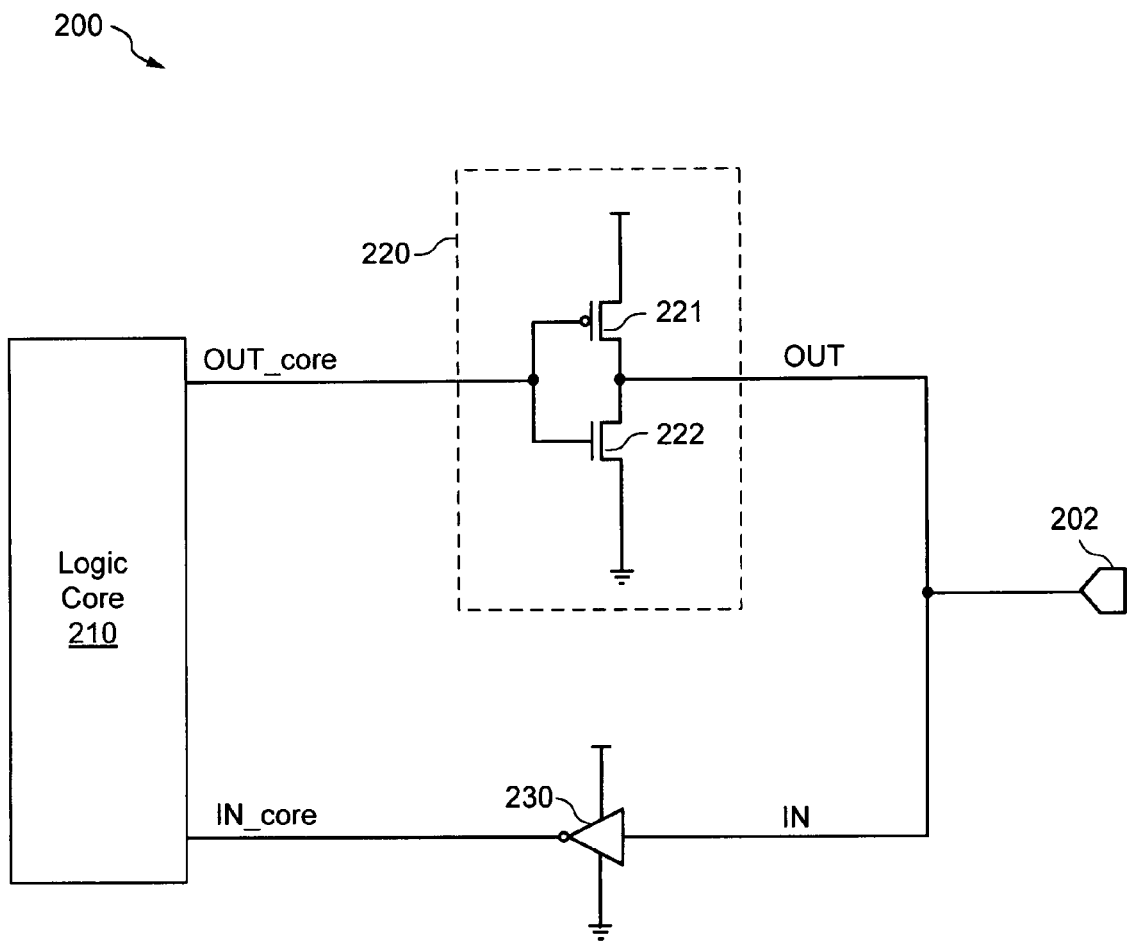
FIG. 2 is a simplified functional block diagram of a conventional I/O circuit coupled between a logic core and a corresponding I/O pad of an IC device.

FIG. 2 shows a simplified functional block diagram of an integrated circuit (IC) device 200 (e.g., such as FPGA device 100A) that includes an I/O pad 202, logic core 210, and conventional I/O circuitry including an input buffer 230 and an output buffer 220. Logic core 210 may include any suitable circuitry such as, for example, configurable logic elements of an FPGA. Input buffer 230, which is well-known, is coupled to pad 202 and buffers input signals (IN) received from pad 202 for input to logic core 210 as IN_core. Output buffer 220, which is well-known, is coupled to logic core 210 and buffers output signals (OUT_core) received from logic core 210 for output to pad 202 as OUT. In some embodiments, I/O circuitry may be more complex, and may include other features or blocks such as flip-flops, clocking structures, delay lines, multiplexers, state machines, configuration memory, level shifters, and other blocks, although not shown in the figures herein.

For example, output buffer 220 includes a PMOS transistor 221 and an NMOS transistor 222 connected in series between a supply voltage and ground potential. In some embodiments, either or both of PMOS transistor 221 and NMOS transistor 222 may be implemented using multiple parallel transistors, where such parallel transistors may have the same or varying sizes, and may be controlled by common shared signals or by different control signals. The commonly-coupled gates of transistors 221 and 222 form an inverter input to receive OUT_core from logic core 210. The commonly-coupled drains of transistors 221 and 222 form an inverter output that is coupled to pad 202. In operation, output buffer 220 drives OUT in response to OUT_core, where OUT has a voltage swing between the supply voltage and ground potential. Although output buffer 220 includes both a PMOS transistor 221 and an NMOS transistor 222, in other embodiments only one of PMOS transistor 221 or NMOS transistor 222 may be implemented, for example for open drain I/O circuits. The examples described herein have both PMOS and NMOS transistors, but in general, embodiments in accordance with the present invention may have only one type of transistor in an output buffer.

As known in the art, output buffer 220 cannot adjust the slew rate of the output signal OUT provided to pad 202. As a result, if the slew rate of OUT (e.g., as determined by the operating characteristics of output buffer 220) are not consistent with the signal switching characteristics of another IC circuit or device coupled thereto, then device 200 may be incompatible with such other IC circuits or devices. For example, if the slew rate of OUT generated by an FPGA device is too fast for circuitry used for test and de-bug circuitry operations, then the FPGA device 200 may not be suitable for use in the test and de-bug market, which is undesirable.

Figure 3:
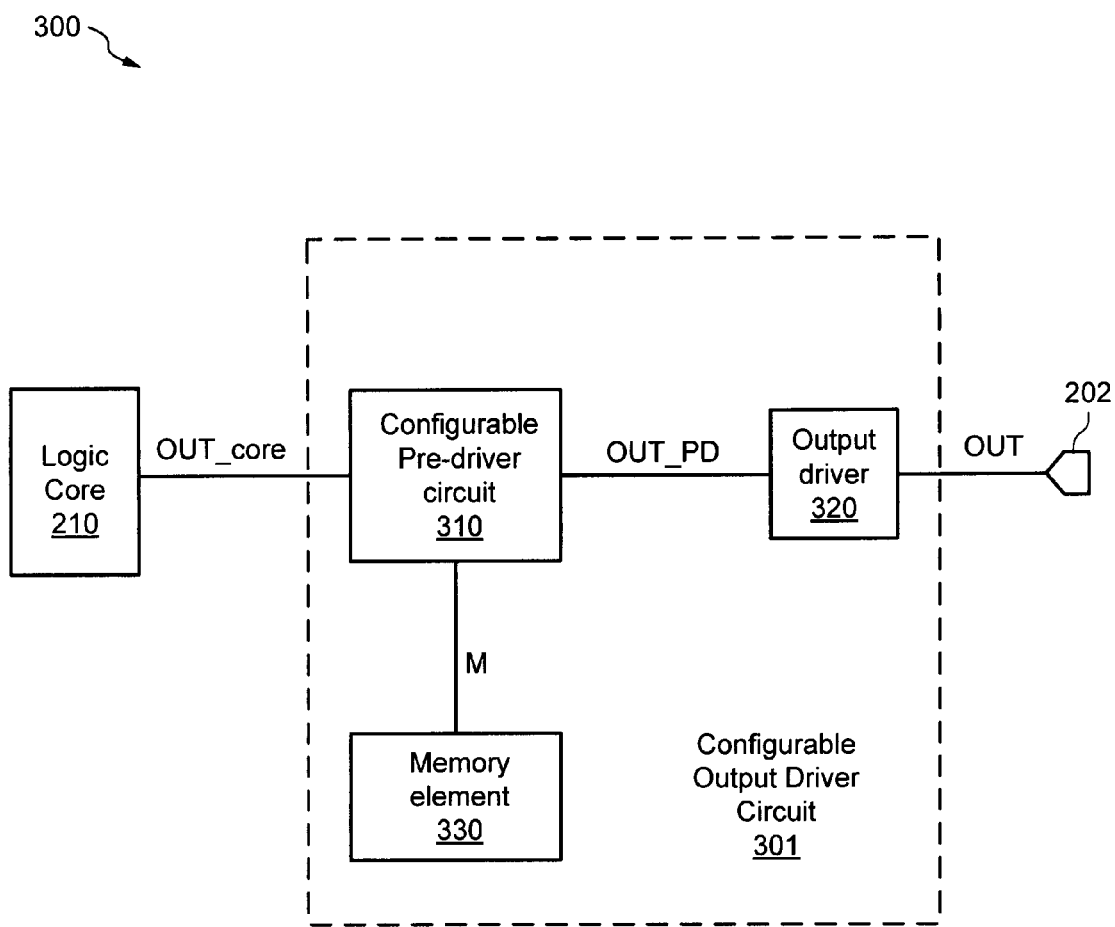
FIG. 3 is a simplified functional block diagram of a configurable output driver circuit in accordance with embodiments of the present invention.

Therefore, a configurable output driver circuit having an adjustable slew rate is disclosed in accordance with embodiments of the present invention. For example, FIG. 3 shows an IC device 300 including I/O pad 202, logic core 210, and a configurable output driver circuit 301 in accordance with some embodiments of the present invention. For simplicity, FIG. 3 shows only one I/O pad 202 connected to only one configurable output driver circuit 301. However, for actual embodiments, IC device 300 may include any number of I/O pads 202 and any number of corresponding configurable output driver circuits 301. IC device 300 can be any suitable IC device such as, for example, a PLD, an ASIC, and so on. For some embodiments, IC device 300 can be an FPGA device such as FPGA device 100A having the power distribution system shown in FIG. 1B. Also for simplicity, FIG. 3 only shows blocks relating to an output buffer, although input logic and circuitry may be included in some embodiments.

Output driver circuit 301 includes a configurable pre-driver circuit 310, an output driver 320, and a memory element 330. Configurable pre-driver circuit 310 includes an input to receive OUT_core from logic core 210, an output terminal coupled to an input of output driver 320, and a control terminal to receive one or more mode control signals M stored in memory element 330. Output driver 320 includes an input to receive a signal OUT_PD from pre-driver circuit 310, and includes an output to provide an output signal OUT to I/O pad 202. In response to the mode control signals M, configurable pre-driver circuit 310 adjusts the slew rate of OUT_PD, which in turn adjusts the slew rate of OUT.

Memory element 330, which can be any suitable memory device including, for example, EEPROM, flash memory, DRAM, SRAM, latches, registers, fuses, and so on, stores the mode control signals M for pre-driver circuit 310. For some embodiments in which IC device 300 is an FPGA, memory element 330 can be one or more of the configuration memory cells (e.g., such as configuration memory cells 106 of FIG. 1B), and the mode control signals M can be programmed into memory element 330 during configuration or re-configuration operations of the FPGA device. Alternatively, memory element 330 can be programmed with the mode control signals M using other well-known circuitry. For example, although not shown in FIG. 3 for simplicity, one or more instructions containing values for M can be provided to memory element 330 via a suitable instruction bus or path during operation of the device, thereby allowing for the dynamic adjustment of OUT's slew rate, for example, in response to user requests, changing operating conditions, and the like. For other embodiments, the values of M can be hardwired (e.g., using fuses or other suitable techniques).

Figure 4:
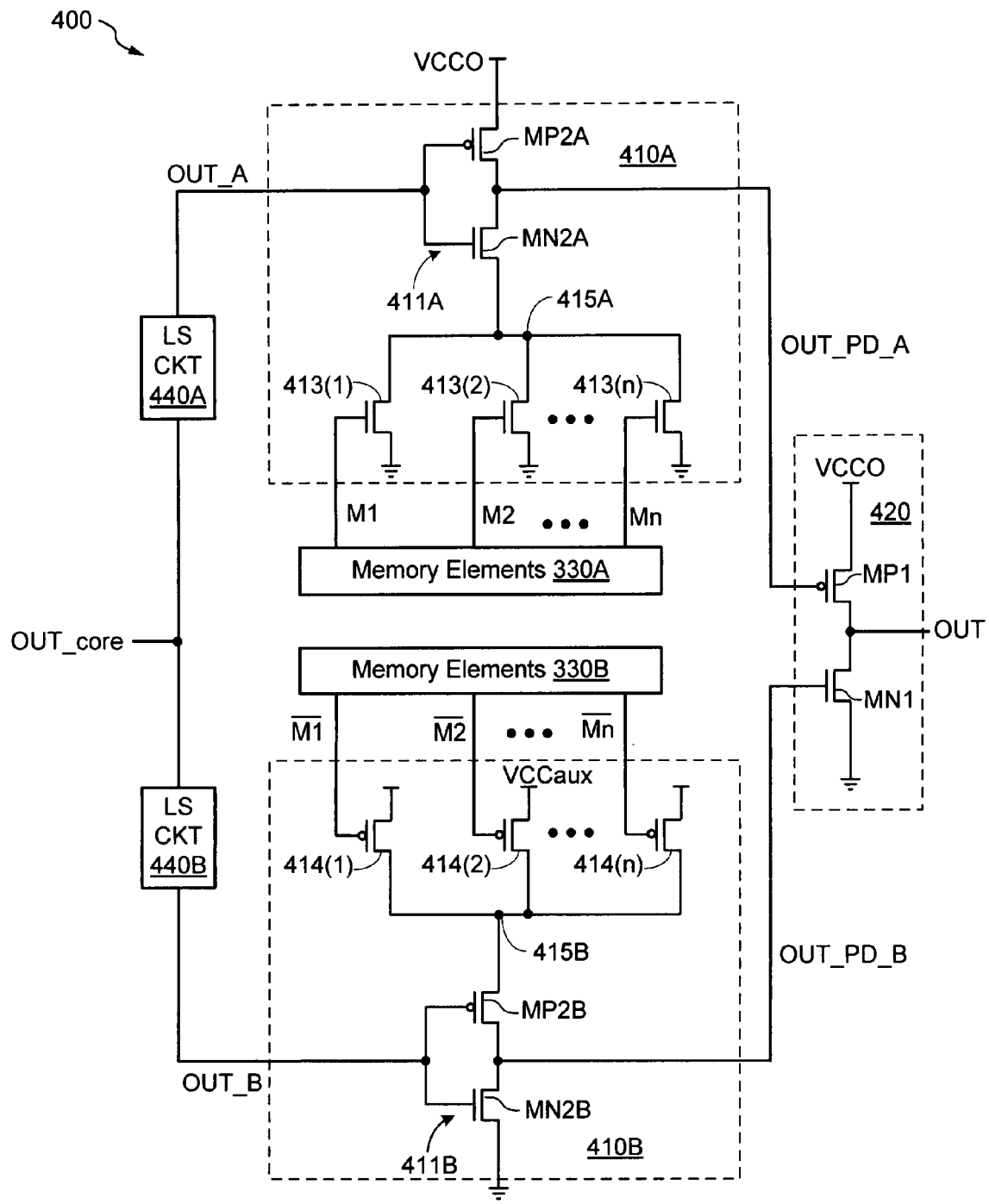
FIG. 4 is a circuit diagram of some embodiments of the configurable output driver circuit of FIG. 3.

More specifically, FIG. 4 shows a configurable output driver circuit 400 that is one embodiment of output driver circuit 301 of FIG. 3. Output driver circuit 400 includes configurable pre-driver circuits 410A-410B, an output driver 420, level-shifter circuits 440A-440B, first memory elements 330A, and second memory elements 330B. Level-shifter circuits 440A-440B, which are well-known, level-shift OUT_core from a lower voltage swing typical of logic signals in core logic 210 to higher voltage swings suitable for input to pre-driver circuits 410A-410B, respectively. For the exemplary embodiment of FIG. 4, level shifter 440A shifts OUT_core to a signal OUT_A having a voltage swing between approximately 0 volts and VCCO, and level shifter 440B shifts OUT_core to a signal OUT_B having a voltage swing between approximately 0 volts and VCCaux. For other embodiments, level shifters 440A-440B can level shift OUT_core to other suitable voltage levels. For still other embodiments, level shifters 440A-440B can be eliminated.

Output driver 420, which is one embodiment of output driver 320 of FIG. 3, is a CMOS inverter formed by the series connection of PMOS output transistor MP1 and NMOS output transistor MN1 between VCCO and ground potential, with the commonly-coupled drains of MP1 and MN1 forming an output that provides OUT to pad 202. The gate of MP1 is coupled to an output of pre-driver circuit 410A, and the gate of MN1 is coupled to an output of pre-driver circuit 410B. For other embodiments, the source of MP1 can be connected to another suitable supply voltage.

Configurable pre-driver circuit 410A includes a CMOS inverter 411A formed by a series-connection of PMOS transistor MP2A and NMOS transistor MN2A between VCCO and a first control node 415A. The input of inverter 411A, which is formed by the commonly-coupled gates of MP2A and MN2A, receives the level-shifted signal OUT_A from level-shifter 440A. The output of inverter 411A, which is formed by the commonly-coupled drains of MP2A and MN2A, provides a first pre-driver output signal OUT_PD_A to the gate of MP1. Configurable pre-driver circuit 410A also includes a plurality of NMOS pull-down transistors 413(1)-413(n) coupled in parallel between control node 415A and ground potential, where the gates of NMOS transistors 413(1)-413(n) receive mode control signals M1-Mn, respectively. The mode control signals M1-Mn are stored in first memory element 330A, which can be programmed prior to device operation (e.g., by a user or by the manufacturer) or during device operation (e.g., by a user).

Configurable pre-driver circuit 410B includes a CMOS inverter 411B formed by a series-connection of PMOS transistor MP2B and NMOS transistor MN2B between a second control node 415B and ground potential. The input of inverter 411B, which is formed by the commonly-coupled gates of MP2B and MN2B, receives the level-shifted signal OUT_B provided by level-shifter 440B. The output of inverter 411B, which is formed by the commonly-coupled drains of MP2B and MN2B, provides a second pre-driver output signal OUT_PD_B to the gate of MN1. Configurable pre-driver circuit 410B also includes a plurality of PMOS pull-up transistors 414(1)-414(n) coupled in parallel between control node 415B and VCCaux, where the gates of PMOS transistors 414(1)-414(n) receive mode control signals $\overline{M1}$-$\overline{Mn}$, respectively, which for some embodiments can be complemented values of M1-Mn, respectively. The mode control signals $\overline{M1}$-$\overline{Mn}$ are stored in second memory element 330B, which can be programmed prior to device operation (e.g., by a user or by the manufacturer) or during device operation (e.g., by a user). Together, memory elements 330A and 330B form memory element 330 of FIG. 3, which as mentioned above can be any suitable storage device or devices.

For some embodiments, memory elements 330A and 330B are configuration memory cells (e.g., such as configuration memory cells 106 of FIG. 1B) powered by Vgg. Thus, although not shown in FIG. 4 for simplicity, circuit 400 can include a first set of well-known level-shifter circuits to level shift mode control signals M1-Mn to VCCO prior to their application to the gates of NMOS pull-down transistors 413 (e.g., to prevent leakage in transistors 413), and can include a second set of well-known level-shifter circuits to level shift mode control signals $\overline{M1}$-$\overline{Mn}$ to VCCaux prior to their application to the gates of PMOS pull-up transistors 414 (e.g., to prevent leakage in transistors 414).

Figure 5:
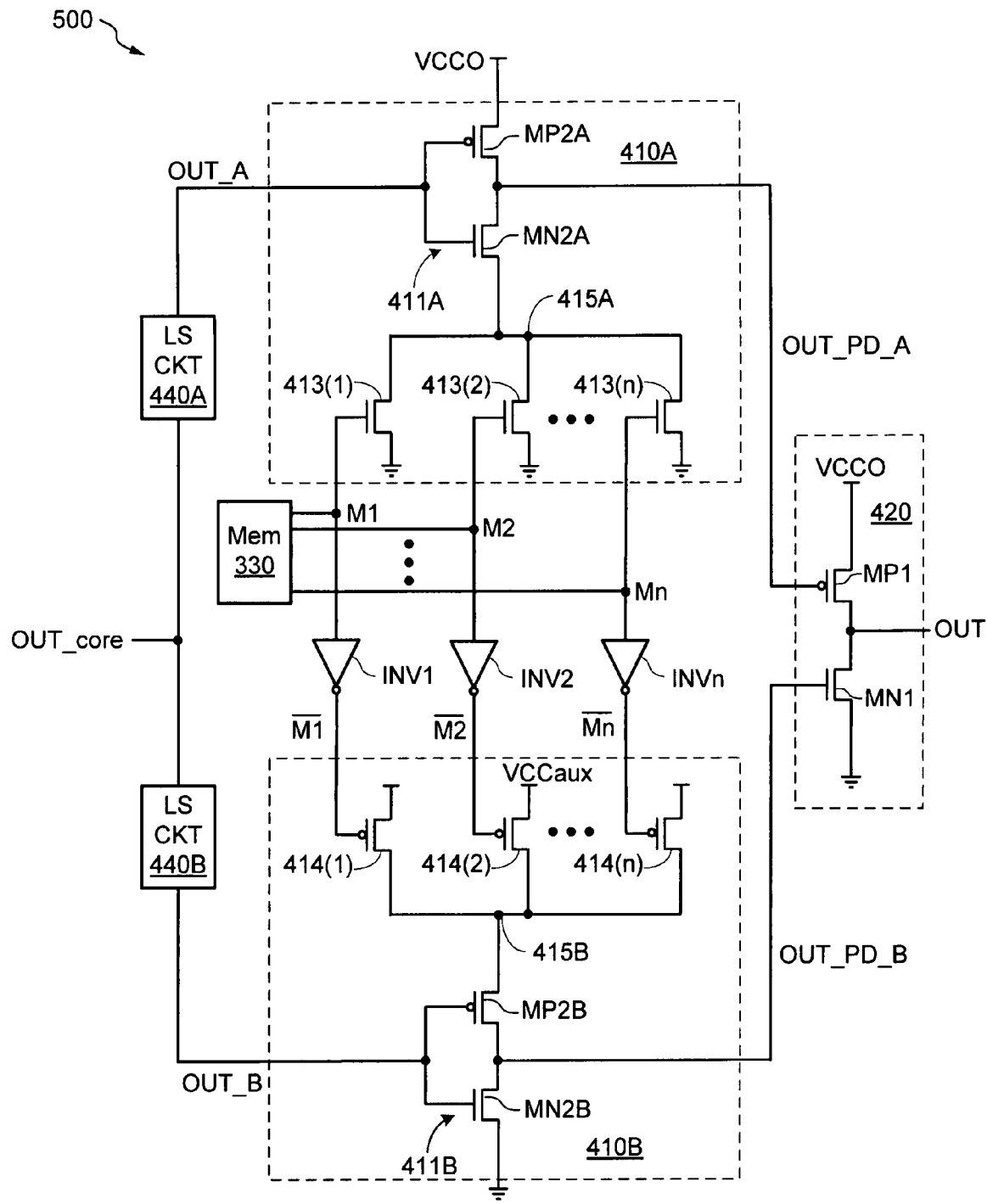
FIG. 5 is a circuit diagram of other embodiments of the configurable output driver circuit of FIG. 3.

For other embodiments, mode signals $\overline{M1}$-$\overline{Mn}$ can be generated in response to respective mode control signals M1-Mn via corresponding CMOS inverters INV1-INVn, as illustrated in FIG. 5, which shows an output driver circuit 500 that is another embodiment of output driver circuit 301 of FIG. 3. For embodiments of FIG. 5, signals M1-Mn can be stored in memory element 330.

For still other embodiments, the values of M1-Mn and/or $\overline{M1}$-$\overline{Mn}$ can be hardwired (e.g., using fuses or other suitable techniques) to desired logic levels to set the slew rate of OUT to a pre-selected value (e.g., by the device manufacturer prior to delivery to a customer or by the customer prior to deployment in an application).

Together, pre-driver circuits 410A-410B form a pre-driver circuit that is one embodiment of pre-driver circuit 310 of FIG. 3. In operation, pre-driver circuit 410A's inverter 411A charges and discharges the gate of output transistor MP1 in response to logic transitions of OUT_core, and pre-driver circuit 410B's inverter 411B charges and discharges the gate of NMOS output transistor MN1 in response to logic transitions of OUT_core. For example, when OUT_core transitions from logic low-to-high, pull-down transistor MN2A and one or more of pull-down transistors 413 of pre-driver 410A turn on and discharge the gate of output transistor MP1 low toward ground potential, thereby turning on MP1 to drive OUT to logic high (e.g., towards VCCO), and pull-down transistor MN2B of pre-driver 410B turns on and discharges the gate of output transistor MN1 low toward ground potential, thereby turning off MN1 to isolate OUT from ground potential. Conversely, when OUT_core transitions from logic high-to-low, pull-up transistor MP2B and one or more of pull-up transistors 414 of pre-driver 410B turn on and charge the gate of output transistor MN1 high toward VCCaux, thereby turning on MN1 to drive OUT to logic low (e.g., towards ground potential), and pull-up transistor MP2A of pre-driver 410A turns on and charges the gate of output transistor MP1 high toward VCCO, thereby turning off MP1 to isolate OUT from VCCO.

As mentioned above, the slew rate of the output signal OUT generated by the configurable output driver circuit 400 is adjustable and can be set to a desired level in response to the mode control signals M. In operation, configurable pre-driver circuit 410A selectively adjusts the discharge rate of output transistor MP1's gate in response to logic low-to-high transitions of OUT_core, and configurable pre-driver circuit 410B selectively adjusts the charge rate of output transistor MN1's gate in response to logic high-to-low transitions of OUT_core. In this manner, pre-driver circuits 410A-410B control and selectively adjust the slew rate of OUT provided by output transistors MP1 and MN1.

More specifically, in response to M1-Mn, a selectable number of NMOS pull-down transistors 413 can be enabled (e.g., turned on) to adjust the series resistance between control node 415A and ground potential, thereby adjusting the discharge rate of MP1's gate and therefore the rate at which MP1 turns on and drives OUT to logic high. Similarly, in response to $\overline{M1}$-$\overline{Mn}$, a selectable number of PMOS pull-up transistors 414 can be enabled (e.g., turned on) to adjust the series resistance between control node 415B and VCCaux, thereby adjusting the charge rate of MN1's gate and therefore the rate at which MN1 drives OUT turns on and to logic low.

For example, when M is set to a value that indicates a minimum (e.g., a slowest) slew rate for OUT, pull-down transistors 413 are configured to provide a maximum series resistance between control node 415A and ground potential to set the turn-on speed of MP1 to a minimum value, and pull-up transistors 414 are configured to provide a maximum series resistance between control node 415B and VCCaux to set the turn-on speed of MN1 to a minimum value. Conversely, when M is set to a value that indicates a maximum (e.g., fastest) slew rate for OUT, pull-down transistors 413 are configured to provide a minimum series resistance between control node 415A and ground potential to set the turn-on speed of MP1 to a maximum value, and pull-up transistors 414 are configured to provide a minimum series resistance between control node 415B and VCCaux to set the turn-on speed of MN1 to a maximum value. Of course, M can be set to other values that cause pre-driver circuits 410A-410B to set the slew rate of OUT to other values between the minimum and maximum values.

Therefore, as described above, the slew rate of OUT provided by output driver circuit 400 can be controlled and selectively adjusted to a desired level by selecting suitable values for M1-Mn, thereby allowing an IC device employing output driver circuits 400 to be used in various applications that require different I/O signal slew rates and/or for which the values of VCCO and/or VCCaux can be selected.

For first embodiments, each of NMOS pull-down transistors 413(1)-413(n) is a different size (e.g., a different channel width and/or length) to provide a different pull-down resistance for the gate of MP1, and each of PMOS pull-up transistors 414(1)-414(n) is a different size (e.g., a different channel width and/or length) to provide a different pull-up resistance for the gate of MN1. In this manner, the rate at which inverter 411A discharges the gate of MP1 is determined by which one of NMOS pull-down transistors 413 is enabled (e.g., turned on) in response to M1-Mn, and the rate at which inverter 411B charges the gate of MN1 is determined by which one of PMOS pull-up transistors 414 is enabled (e.g., turned on) in response to $\overline{M1}$-$\overline{Mn}$. For one embodiment, transistors 413(1) and 414(1) are sized to minimum values (e.g., relative to the sizes of other pull-down transistors 413 (2)-413(n) and pull-up transistors 414(2)-414(n), respectively) such that when only M1 and $\overline{\text{M1}}$ are asserted (e.g., where M2-Mn and $\overline{\text{M2}}$-$\overline{\text{Mn}}$ are de-asserted), only transistors 413(1) and 414(1) are enabled and cause the slew rate of OUT to be a minimum value of approximately 0.5 volts/ns, which is much slower than typical FPGA device output signal switching speeds but suitable for slower applications such as test and de-bug operations. For other embodiments, transistors 413(1) and 414(1) can be sized to provide another desired minimum slew rate for OUT.

Figure 6:
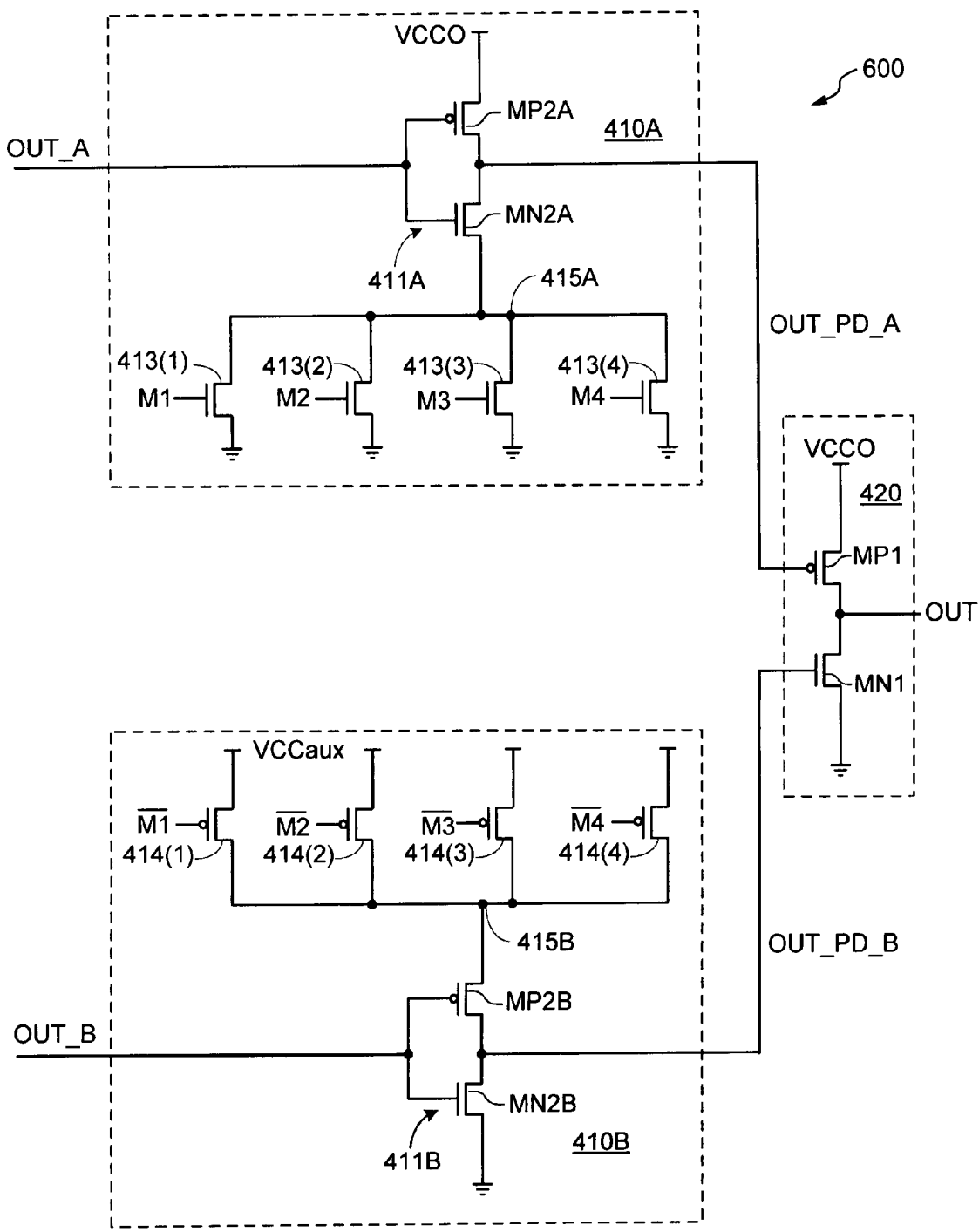
FIG. 6 is a circuit diagram of one embodiment of the configurable output driver circuit of FIG. 5.

For these first embodiments, the slew rate of OUT can be increased to higher values (e.g., for applications requiring faster I/O signal slew rates) by using mode control signals M1-Mn to enable other pairs of pull-down transistors 413 and pull-up transistors 414 having different sizes and thus having different series resistances. For example, the slew rate of OUT can be set to a maximum value by setting one of M1-Mn to enable the largest of pull-down transistors 413 and by setting one of $\overline{\text{M1}}$-$\overline{\text{Mn}}$ to enable the largest of pull-up transistors 414, and the slew rate of OUT can be set to other intermediate values by selectively enabling other pairs of transistors 413-414 that have other intermediate sizes (e.g., as compared with the smallest and largest sizes of pull-down transistors 413 and of pull-up transistors 414). For one embodiment, pre-driver 410A includes four NMOS pull-down transistors 413, and pre-driver 410B includes four PMOS pull-up transistors 414, as shown in FIG. 6, although for other embodiments any number of transistors 413 and 414 may be provided.

For second embodiments, each of NMOS pull-down transistors 413(1)-413(n) can be the same or similar size, and each of PMOS pull-up transistors 414(1)-414(n) can be the same or similar size. Thus, for these second embodiments, the rate at which inverter 411A discharges the gate of MP1 is determined by how many of the NMOS pull-down transistors 413 are enabled (e.g., turned on) in response to M1-Mn, and the rate at which inverter 411B charges the gate of MN1 is determined by how many of the PMOS pull-up transistors 414 are enabled (e.g., turned on) in response to $\overline{\text{M1}}$-$\overline{\text{Mn}}$. For example, to set the slew rate of OUT to a minimum (e.g., the slowest) level, only one of the mode control signals M1-Mn is asserted so that only one NMOS pull-down transistor 413 is enabled (e.g., conductive) to maximize the series resistance of the discharge path of MP1's gate, and only one of the mode control signals $\overline{\text{M1}}$-$\overline{\text{Mn}}$ is asserted so that only one PMOS pull-up transistor 414 is enabled (e.g., conductive) to maximize the series resistance of the charge path of MN1's gate.

For these second embodiments, the slew rate of OUT can be incrementally increased by asserting greater numbers of the mode control signals M1-Mn and $\overline{\text{M1}}$-$\overline{\text{Mn}}$ to turn on increasing numbers of the NMOS pull-down transistors 413 and the PMOS pull-up transistors 414, respectively, thereby incrementally decreasing the series resistance of MP1's gate and incrementally decreasing the series resistance of MN1's gate, respectively. Thus, a maximum (e.g., the fastest) slew rate for OUT can be selected by asserting all mode control signals M1-Mn and $\overline{\text{M1}}$-$\overline{\text{Mn}}$ so that all NMOS pull-down transistors 413 and all PMOS pull-up transistors 414 are enabled to minimize the series resistance between MP1's gate and ground potential and to minimize the series resistance between MN1's gate and VCCaux, respectively.

In other embodiments, the transistors 413 and 414 may have other sizes. For instance, the transistors may have size ratios that correspond to powers of 2. This may allow for a wide range of slew rate control with relatively few devices.

Note that for the various embodiments of FIG. 4, inverter 411A does not include any individually selectable pull-up transistors coupled in parallel between MP1's gate and VCCO because it is desirable to maintain the charge rate of MP1's gate at a maximum level to turn off MP1 quickly during logic high-to-low transitions of OUT_core quickly, and inverter 411B does not include any individually selectable pull-down transistors coupled in parallel between MN1's gate and ground potential because it is desirable to maintain the discharge rate of MN1's gate at a maximum level to turn off MN1 quickly during logic low-to-high transitions of OUT_core. By turning off output transistors MP1 and MN1 quickly, undesirable DC current flow between VCCO and ground potential through output inverter 420 (e.g., crow-bar current) is minimized, which in turn minimizes DC power dissipation. Further, the omission of such additional pull-up and pull-down transistors advantageously minimizes circuit area.

In addition, the operating voltage of many FPGA devices can be programmed to a desired level by a customer to comply with a particular I/O standard, such as the PCI standard. Because the slew rate of an output signal is affected by the device's operating voltage (e.g., increasing the operating voltage typically decreases transistor propagation delays and thus increases the output signal slew rate), changing the operating voltage can undesirably change the output signal slew rate. More specifically, for some FPGA devices, the value of VCCaux can be selected by the customer to be a desired value (e.g., either 2.5 v or 3.3 v). Thus, in accordance with some embodiments of the present invention, the series resistance between the gate of PMOS output transistor MP1 and ground potential and the series resistance between the gate of NMOS output transistor MN1 and VCCaux can be selectively adjusted by the customer in response to the mode control signal(s) so that output driver 420 maintains a specified slew rate for OUT, irrespective of the value of VCCaux.

Figure 7:
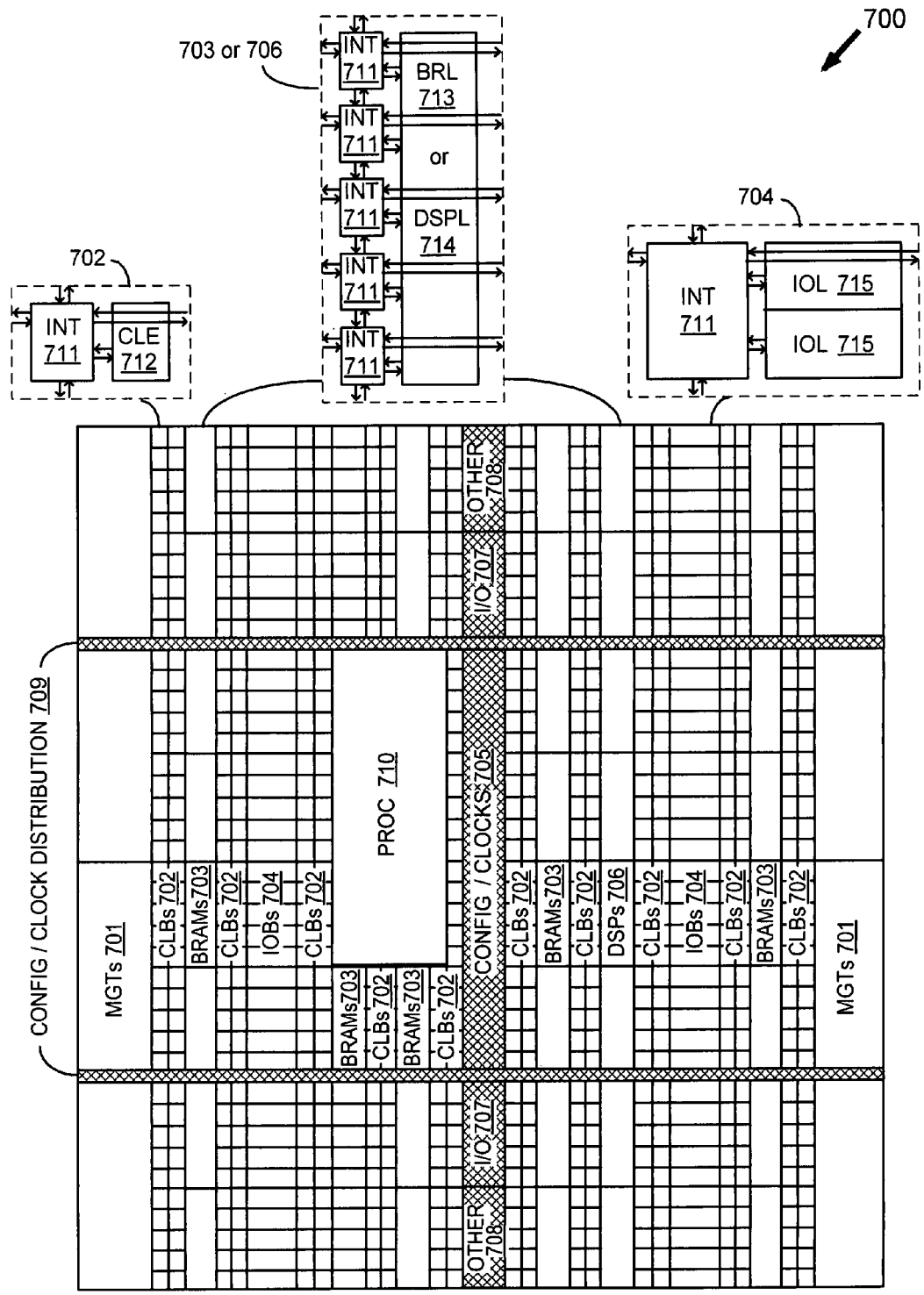
FIG. 7 illustrates another FPGA architecture within which embodiments of the present invention may be implemented.

As noted above, advanced FPGAs can include several different types of programmable logic blocks in the array. For example, FIG. 7 illustrates another FPGA architecture 700 within which embodiments of the present invention may be implemented that includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 can include a configurable logic element (CLE 712) that can be programmed to implement user logic plus a single programmable interconnect element (INT 711). A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element (INT 711). As will be clear to those of skill in the art, the actual I/O pads connected, for example, to the I/O logic element 715 typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

In accordance with embodiments of the present invention, IOBs 704 of an FPGA architecture 700 may include slew rate controls as described above. Note that other embodiments, other FPGA architectures may include slew rate controls as described above, and in general any integrated circuit may include such slew rate controls. For example, although the architecture shown in FIG. 7 corresponds to a device having flip-chip I/O, other types of I/O, including wirebonding to peripheral I/O, may be used in accordance with embodiments of the present invention.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. An output circuit for an integrated circuit (IC) device, the output circuit having an output terminal for providing an output signal having a programmable slew rate, the output circuit comprising:
    an output driver including an output transistor coupled between a first supply voltage and the output terminal; and
    a pre-driver circuit having an input to receive a logic signal, having an output coupled to a gate of the output transistor, and having an input to receive a mode control signal comprising a plurality of control signals,
        wherein the pre-driver circuit selectively adjusts a series resistance between the gate of the output transistor and a second supply voltage in response to the mode control signal by selectively enabling one or more paths of a plurality of paths between the gate of the output transistor and the second supply voltage,
        wherein the output transistor is a PMOS output transistor, wherein the pre-driver circuit is a first pre-driver circuit, wherein the second supply voltage is ground potential, and wherein the output driver includes an NMOS output transistor coupled between the output terminal and the ground potential, the output circuit further comprising:
    a second pre-driver circuit having an input to receive the logic signal, having an output coupled to a gate of the NMOS output transistor, and having an input to receive the mode control signal, wherein the second pre-driver circuit selectively adjusts a series resistance between the gate of the NMOS output transistor and the first supply voltage in response to the mode control signal, and
        wherein the first pre-driver circuit comprises:
            a first pull-up transistor coupled between the first supply voltage and the gate of the PMOS output transistor and having a gate to receive the logic signal;
            a first pull-down transistor coupled between the gate of the PMOS output transistor and a first control node and having a gate to receive the logic signal; and
            a plurality of selectable pull-down transistors coupled in parallel between the first control node and the ground potential, wherein each of the selectable pull-down transistors has a gate to receive a corresponding one of the plurality of control signals; and
        the second pre-driver circuit comprises:
            a second pull-down transistor coupled between the ground potential and the gate of the NMOS output transistor and having a gate to receive the logic signal;
            a second pull-up transistor coupled between the gate of the NMOS output transistor and a second control node and having a gate to receive the logic signal; and
            a plurality of selectable pull-up transistors coupled in parallel between the second control node and a third supply voltage, wherein each of the selectable pull-up transistors has a gate to receive a corresponding one of the plurality of control signals.

2. The output circuit of claim 1, further comprising:
    a memory element coupled to the pre-driver circuit, the memory element configured to store the mode control signal.

3. The output circuit of claim 2, wherein the IC device comprises a field programmable gate array (FPGA) device, and the memory element comprises one or more configuration memory cells.

4. The output circuit of claim 1, wherein each of the selectable pull-down transistors has a different size, and the plurality of control signals selectively enables only one of the selectable pull-down transistors to provide a discharge path between the gate of the PMOS output transistor and the second voltage supply.

5. The output circuit of claim 1, wherein the plurality of control signals simultaneously enable a selected number of the selectable pull-down transistors to provide a discharge path between the gate of the PMOS output transistor and the second voltage supply.

6. The output circuit of claim 1, wherein the first and third supply voltages are different.

7. The output circuit of claim 1, wherein the IC device comprises a field programmable gate array (FPGA) device, and the mode control signal is hardwired to at least one logic state.

8. An output circuit for an integrated circuit (IC) device, the output circuit having an output terminal for providing an output signal having a programmable slew rate, the output circuit comprising:
- an output driver including an output transistor coupled between a first supply voltage and the output terminal;
- a pre-driver circuit, comprising:
  - a CMOS inverter having power terminals coupled to the first supply voltage and to a first control node, having an input to receive a logic signal, and having an output coupled to a gate of the output transistor; and
  - a plurality of intermediate transistors coupled in parallel between the first control node and a second supply voltage, each intermediate transistor having a gate to receive a corresponding mode control signal of a plurality of mode control signals;
- wherein the output transistor is a PMOS output transistor, wherein the pre-driver circuit is a first pre-driver circuit, wherein the CMOS inverter is a first CMOS inverter, wherein the second supply voltage is ground potential, wherein the plurality of intermediate transistors is a plurality of pull-down transistors, and wherein the output driver includes an NMOS output transistor coupled between the output terminal and the ground potential, the output circuit further comprising:
- a second pre-driver circuit, comprising:
  - a second CMOS inverter having power terminals coupled to a third supply voltage and to a second control node, having an input to receive the logic signal, and having an output coupled to a gate of the NMOS output transistor; and
  - a plurality of pull-up transistors coupled in parallel between the second control node and the third supply voltage, each pull-up transistor having a gate to receive a corresponding one of the mode control signals.

9. The output circuit of claim 8, further comprising:
a memory element coupled to the pre-driver circuit, the memory element configured to store the plurality of mode control signals.

10. The output circuit of claim 8, wherein each of the mode control signals is hardwired to a selected logic state.

11. The output circuit of claim 8, wherein each of the intermediate transistors has a different size.

12. The output circuit of claim 11, wherein the plurality of mode control signals selectively enables only one of the pull-down transistors to provide a discharge path between the gate of the output transistor and the second supply voltage.

13. The output circuit of claim 8, wherein the plurality of mode control signals enables a selected number of the intermediate transistors.

14. The output circuit of claim 13, wherein each of the intermediate transistors has a same size.

15. The output circuit of claim 8, wherein a series resistance between the gate of the output transistor and the second supply voltage is selectively adjusted in response to the plurality of mode control signals.

16. The output circuit of claim 8, wherein the IC device comprises a field programmable gate array (FPGA) device, and the plurality of mode control signals are provided by one or more configuration memory cells of the FPGA device.

* * * * *